United States Patent [19]

Yoshikawa et al.

[11] 4,320,191

[45] Mar. 16, 1982

[54] PATTERN-FORMING PROCESS

[75] Inventors: Akira Yoshikawa, Higashi Yamato; Osamu Ochi, Kodaira; Tomoko Hisaki, Hamura; Yoshihiko Mizushima, Fuchu, all of Japan

[73] Assignee: Nippon Telegraph & Telephone Public Corporation, Tokyo, Japan

[21] Appl. No.: 201,663

[22] PCT Filed: Nov. 1, 1979

[86] PCT No.: PCT/JP79/00280
§ 371 Date: Jul. 7, 1980
§ 102(e) Date: Jul. 7, 1980

[87] PCT Pub. No.: WO80/01020
PCT Pub. Date: May 15, 1980

[51] Int. Cl.$^3$ ............................................... G03C 5/00
[52] U.S. Cl. .................... 430/296; 430/313; 430/317; 430/323; 156/643; 427/43.1
[58] Field of Search ............ 430/296, 314, 317, 323, 430/324, 313; 156/643; 427/38, 43.1

[56] References Cited

U.S. PATENT DOCUMENTS

| | | | |
|---|---|---|---|
| 4,056,395 | 11/1977 | Sato et al. | 156/643 X |
| 4,092,210 | 5/1978 | Hoepfner | 156/643 |
| 4,127,414 | 11/1978 | Yoshikawa et al. | 430/323 |
| 4,207,105 | 6/1980 | Sato | 430/432 |

*Primary Examiner*—Mary F. Downey
*Attorney, Agent, or Firm*—Sughrue, Mion, Zinn, Macpeak & Seas

[57] ABSTRACT

This invention relates to a pattern-forming process using a radiation sensitive chalcogenide layer composed of a laminate of amorphous chalcogenide layer (2) and thin silver layer (3), and discloses a pattern-forming process characterized by etching out an amorphous chalcogenide layer (22) not doped with silver at an unexposed area under an irradiation of a light (6) or an accelerated corpuscular beam by a plasma etching with a fluorine-series gas and also a pattern-forming process wherein silver-doped amorphous chalcogenide layer (21) left on the substrate according to a given pattern by the above process is used as an etching mask and then the substrate layer (1c) is etched out by a plasma etching to form the given pattern on the substrate.

2 Claims, 18 Drawing Figures

PATTERN-FORMING PROCESS

TECHNICAL FIELD

The present invention relates to a process for forming patterns with a radiation sensitive chalcogenide layer consisting of an amorphous chalcogenide layer and a thin silver layer superimposed thereon, wherein gas plasma etching is applied to the pattern-forming step.

BACKGROUND ART

Heretofore, photoresists using polymer materials have been used in the manufacture of IC, LSI and the like as well as in various microfabrications. However, the photo-etching step using these polymer photoresists has the following drawbacks because the developing and rinsing treatments of the photoresist after the exposure are carried out by immersing in developing and rinsing solutions, each of which is determined according to the respective photoresist used. That is, strict quality control for the above treating solutions is required and great care must be taken in setting the treating conditions and as a result, the photo-etching step is lacking in reproducibility and stability; degradation of pattern precision is caused by swelling deformation; the automating of this step becomes disadvantageous; the waste liquor disposal can be a problem. Lately, dry etching technique using a gas plasma has been introduced into the production process of semiconductor devices but treatment with developing and rinsing solutions is unavoidable as long as the photo-etching step using the conventional polymer photoresists remains in the production process. Thus it cannot be denied that the production process has not become completely dry. Even in the field of electron lithography and X-ray lithography, the above mentioned drawbacks are unavoidable as long as the polymer resist is used.

On the other hand, there have hitherto been proposed pattern-forming materials and a method of forming patterns with such materials (U.S. Pat. No. 4,127,414, A. Yoshikawa et al.), wherein a radiation sensitive chalcogenide layer 4 consisting of an amorphous chalcogenide layer 2 and a thin silver layer 3 successively superimposed on a substrate 1, as shown in FIG. 1, is exposed to a light 6 through a mask 5 having a given pattern as shown in FIG. 2 or an accelerated corpuscular beam 7, such as electron beam or the like, according to a given pattern as shown in FIG. 3, whereby silver is diffused into the amorphous chalcogenide layer at the exposed areas to form silver-doped amorphous chalcogenide layers 21 corresponding to the given pattern, and then an etching treatment is carried out with a first etchant dissolving off silver as shown in FIG. 4 and further with an alkaline solution dissolving off the amorphous chalcogenide layer 22 containing no silver as shown in FIG. 5. This is based on the fact that the amorphous chalcogenide film is easily soluble in the alkaline solution but becomes insoluble in the alkaline solution after being doped with silver, so the silver-doped amorphous chalcogenide layers are left on the substrate according to the given pattern.

In general, the amorphous chalcogenide film has a strong resistance to various acid solutions. Therefore, the silver-doped amorphous chalcogenide layer 21 can be used as an etching mask for a third etching treatment with a third etchant etching the substrate, as shown in FIG. 6. Furthermore, when a fourth etching treatment is carried out with a fourth etchant dissolving off the silver-doped amorphous chalcogenide layer, the substrate can be processed according to a given pattern, as shown in FIG. 7. In this connection, it has also been proposed that the radiation sensitive chalcogenide layer 4 consisting of the amorphous chalcogenide layer and the thin silver layer superimposed thereon can be used as a photoresist and an electron-resist (or so-called inorganic resist) (U.S. Pat. No. 4,127,414, A. Yoshikawa et al.).

However, the pattern-forming step using such an inorganic resist includes the solution treatment as described above, so that the use of the inorganic resist has the inevitable drawbacks accompanying the solution treatment, just as with the conventional polymer resists.

DISCLOSURE OF INVENTION

In order to overcome the above drawbacks, detailed investigations with respect to the pattern-forming process using the aforementioned radiation sensitive chalcogenide layer has been done. As a result, it has been found that the etching treatment with solution can be replaced by a dry etching treatment with a gas plasma. That is, the present invention is to propose a novel pattern-forming process applying a plasma etching process. The present invention will be described in greater detail with reference to the accompanying drawing below.

BEST MODE OF CARRYING OUT THE INVENTION

Figure 8:
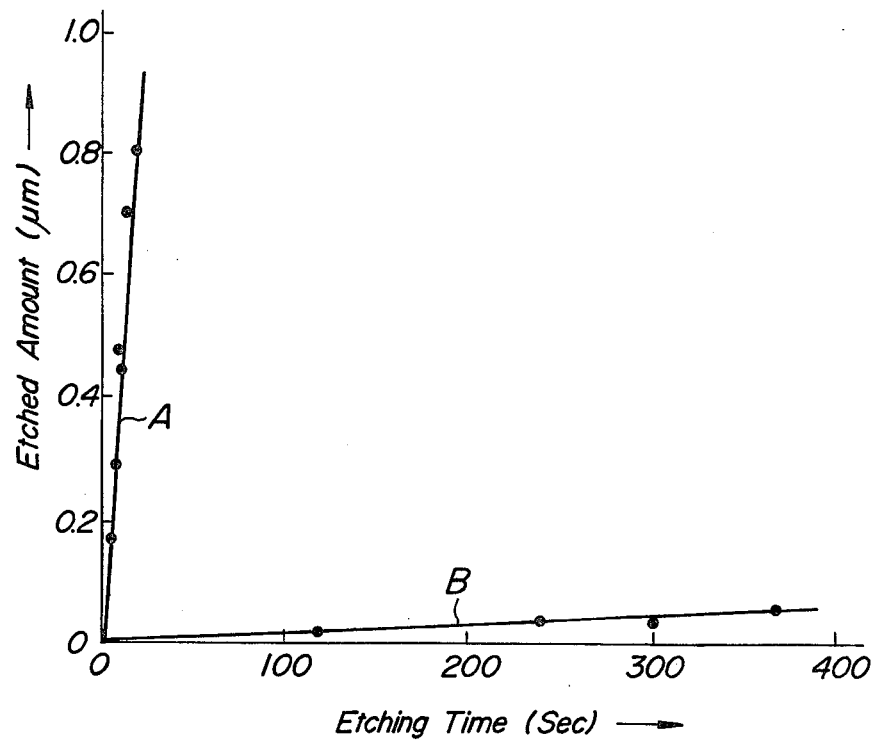
FIG. 8 is a graphical representation showing the etching characteristic of amorphous chalcogenide film with gas plasma as the relation between the etching depth and the etching time.

The present invention is based on the novel discovery that the etching rate of an amorphous chalcogenide film containing Se as a main ingredient in a plasma discharge of fluorine-series gas such as $CF_4$ or the like varies largely depending on the presence of silver dopant. First, this phenomenon is explained in detail by experiments. FIG. 8 shows experimental results relating the etched amount (depth) of amorphous $Se_{75}Ge_{25}$ (atomic percent) amorphous film in $CF_4$ gas plasma to the etching time: curved line A is for no silver doping and curved line B is with silver doping. The amorphous $Se_{75}Ge_{25}$ film was formed on a substrate of silicon wafer at a rate of about 100 Å/minute by a high frequency sputtering and had a thickness of about 0.8 μm. The thin silver layer was formed by immersing the amorphous $SE_{75}Ge_{25}$ film together with the substrate in an electroless silver plating solution containing AgCN as the main ingredient at room temperature for 4 minutes and had a thickness of about 80 Å. The silver doping was carried out by irradiating with a mercury lamp for 100 seconds.

The light intensity was 16 mW/cm$^2$. The CF$_4$ gas plasma was produced by applying a high frequency field of 13.56 MHz to CF$_4$ gas maintained at 0.5 Torr. In this case, the high frequency power was 100 W.

From FIG. 8, it is apparent that the etching rates of amorphous Se$_{75}$Ge$_{25}$ film with no silver doping and silver-doped amorphous SE$_{75}$Ge$_{25}$ film in the CF$_4$ gas plasma are 500 Å/second and 1.4 Å/second, respectively, giving an etching rate ratio of 360.

The feature that the etching rate of the amorphous chalcogenide film varies largely in the etching with CF$_4$ gas plasma is a novel discovery, never anticipated in the prior art. Therefore, when using such selective etching characteristics dependent upon the presence of silver doping, the etching step with an alkaline solution can be replaced by etching with CF$_4$ gas plasma in the conventionally proposed pattern-forming process using a radiation sensitive chalcogenide layer consisting of a laminate of amorphous chalcogenide layer and thin silver layer.

Figure 9:
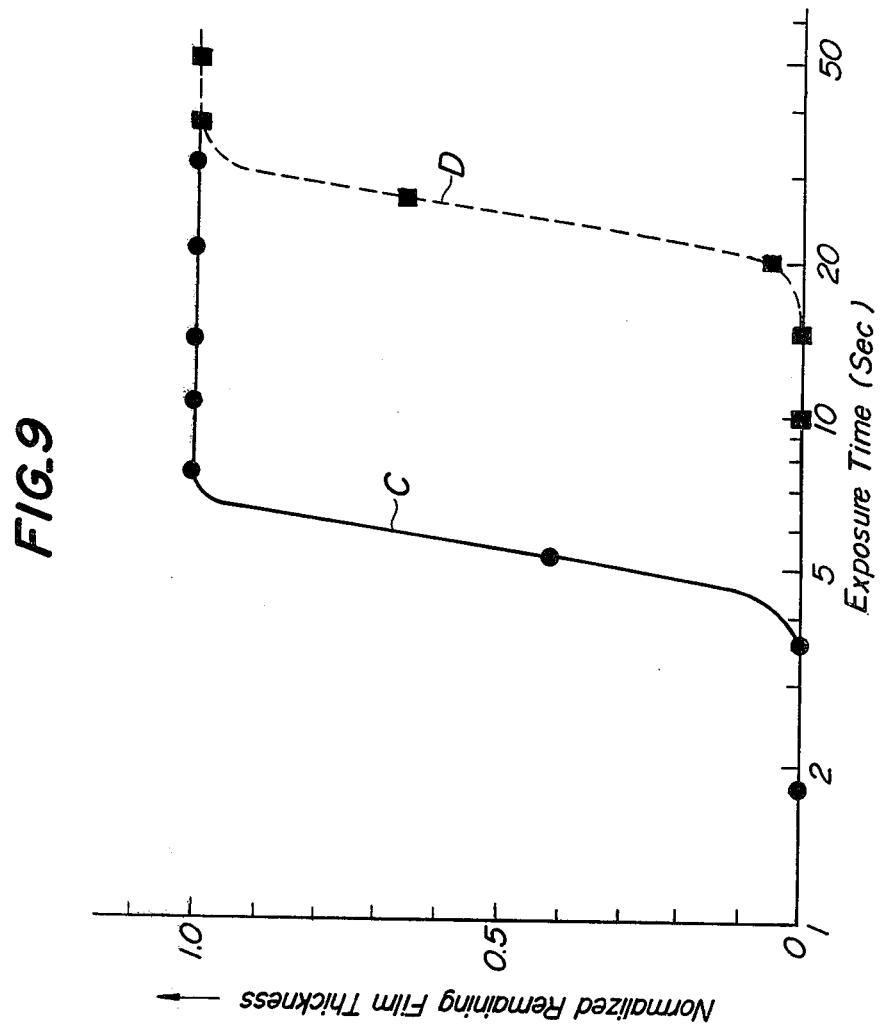
FIG. 9 is a graphical representation showing the exposure characteristics as the relation between the normalized remaining film thickness and the exposure time in an etching with plasma or alkali solution.

For the comparison with etching using the alkaline solution, another experiment is shown in FIG. 9. In the experiment of FIG. 9, after the thin silver layer with a thickness of about 80 Å was formed on the amorphous Se$_{75}$Ge$_{25}$ film with a thickness of 2500 Å in the same manner as described in FIG. 8, exposure treatment was carried out by changing exposure times, excess undoped silver was dissolved out by treating with an aqueous diluted solution of aqua regia, and plasma etching treatment with CF$_4$ gas at 0.5 Torr and 100 W for 60 seconds and etching with 20% aqueous solution of dimethylamine for 60 seconds was done to compare the etching treatments.

FIG. 9 shows the measured value of the remaining film thickness after the etching treatment of each specimen as normalized remaining film thickness plotted against exposure time, wherein curved line C is the case of etching with gas plasma and curved line D is the case of etching with alkali solution. As is apparent from FIG. 9, the value of $\gamma$, which shows the contrast of a resist (which is determined by a slope of the tangent of the curve. The higher the $\gamma$-value, the higher the contrast and hence the higher the resolution), is about 4.5 for both the plasma and alkali etching treatments. However, the sensitivity of the resist determined from FIG. 9 (which is defined by the exposure amount necessary to make the normalized remaining film thickness, for instance, 0.5) is about 5 times as high in the plasma etching as in the alkali etching. This fact is clearly advantageous in the application of the plasma etching to the pattern-forming step.

Although the above experiments have been explained with respect to the case of using CF$_4$ gas, any gas may be used which shows selective etching characteristics as shown in FIG. 8, including C$_2$F$_6$, C$_3$F$_8$, CClF$_3$ and a mixture of O$_2$, N$_2$, Ar or the like added to CF$_4$. Furthermore, these experiments have also been explained with respect to amorphous Se$_{75}$Ge$_{25}$ film, but the etching behavior shown in FIG. 8 is exhibited in any amorphous chalcogenide film in which doping with silver occurs by irradiation of an accelerated corpuscular beam such as a light beam, electron beam or the like and a sufficiently high vapor pressure is produced in the reaction with the gas plasma, examples of which include two-, three-, and four-component amorphous chalcogenide films containing Se, S, As or Ge as a main ingredient. Therefore, all of these amorphous chalcogenide films can be applied to the pattern-forming process according to the invention. From the above, it is understood that the dry etching process can be applied to the stage of from FIG. 4 to FIG. 5 among the pattern-forming stages shown in FIGS. 1–7.

Figure 4:
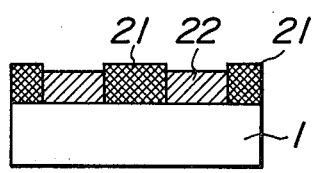
Figure 5:
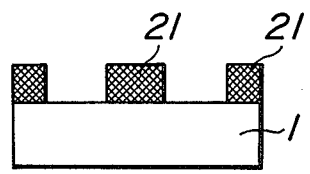

Next, there will be described the application of the dry etching process to the stage of from FIG. 5 to FIG. 6, i.e. the step of etching the substrate layer with silver-doped amorphous chalcogenide layer as an etching mask. As shown by curved line B in FIG. 8, the silver-doped amorphous chalcogenide layer has a relatively high resistance to gas plasma etching and hence has satisfactory applicability as an etching mask in the gas plasma etching of the substrate layer. In the application to this stage, the silver-doped amorphous chalcogenide layer depends upon the material and thickness of the substrate layer to be patterned, but it can be used as a plasma etching mask on, for instance, Si single crystal, Si polycrystal, Si$_3$N$_4$, Mo, W, Cr and the like. Therefore, the stages of from FIG. 4 to FIG. 6 can be carried out continuously in the same apparatus, which is a great merit of the pattern-forming process according to the invention.

Figure 1:
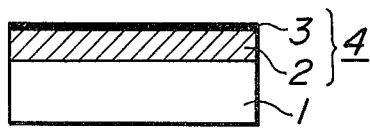
FIGS. 1 to 7 are diagrammatic sectional views of a substrate and radiation sensitive chalcogenide layer in various stages of the pattern-forming process using the radiation sensitive chalcogenide layer.
Figure 2:
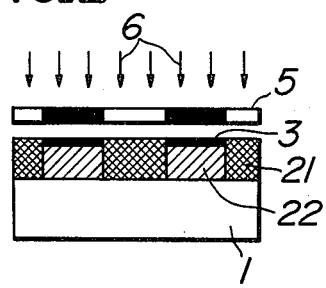
Figure 3:
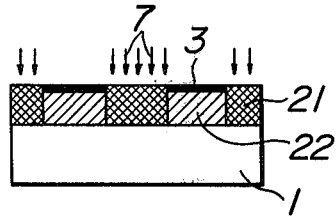

Now, there will be described the application of the dry etching process to the stage of from FIG. 2 or 3 to FIG. 4, i.e. the stage of removing the thin sliver layer from non-exposed areas. In this stage, etching treatment with gas plasma does not give a good result because silver in the non-exposed area is doped into the amorphous chalcogenide layer by the discharge glow of gas to produce so-called fogging. However, the influence of the discharge glow can be removed by adopting the conventional method wherein the etching is carried out outside the plasma producing part. As a result, the plasma etching process is applicable to this stage. In this case, the use of gas containing chlorine or oxygen is effective. Alternatively, the sputter etching process with Ar gas is applicable.

Figure 6:
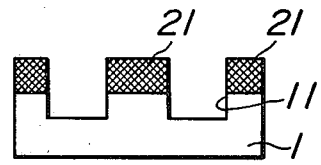
Figure 7:
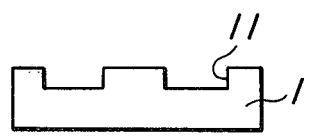

When the substrate layer has sufficiently high resistance to plasma etching, a long-time plasma etching with a fluorine-series gas is also applicable to the stage of removing the silver-doped amorphous chalcogenide layer used as an etching mask for the substrate layer at the stage of from FIG. 6 to FIG. 7. Alternatively, the dry state of this stage can be realized by evaporating the silver-doped amorphous chalcogenide layer by heating in an inert gas atmosphere or under vacuum independently of the plasma etching. In the pattern-forming process according to the invention, the formation of the thin silver layer on the amorphous chalcogenide layer is satisfactorily achieved by immersion into a silver-containing solution, but it is, of course, possible to replace this procedure by vapor deposition or sputtering process. As is apparent from the above, the invention makes it possible to change all stages into dry photo-etching stages and can thus bring about a marked advance in the production of IC, LSI and the like.

An example of the invention will further be described in detail with reference to FIGS. 10–18.

EXAMPLE 1

Figure 10:
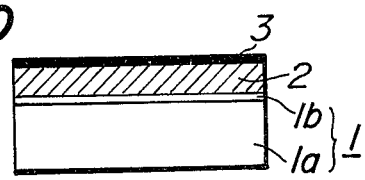
FIGS. 10 to 13 and FIGS. 14 to 18 are diagrammatic sectional views of specimens in various stages using the present invention, respectively.

As shown in FIG. 10, a SiO$_2$ layer 1b with a thickness of 2000 Å was formed on a silicon wafer 1a by thermal oxidation. The system of silicon wafer 1a and SiO$_2$ layer 1b corresponds to a substrate 1. Moreover, the formation of the SiO$_2$ layer is to serve as a stopping layer to plasma etching. Next, an amorphous Se$_{75}$Ge$_{25}$ chalcogenide layer 2 with a thickness of 1500 Å was formed on the SiO$_2$ layer by high frequency sputtering in Ar gas.

Figure 11:
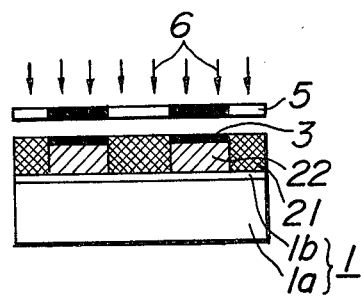
Figure 12:
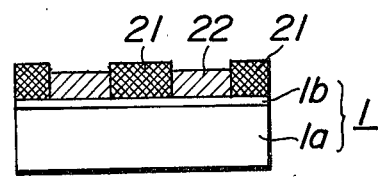
Figure 13:
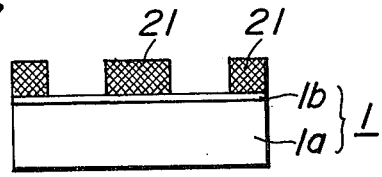

Then, the amorphous $Se_{75}Ge_{25}$ layer together with the substrate was immersed into an electroless silver plating solution containing AgCN as the main ingredient at room temperature for 4 minutes to form a thin silver layer 3 with a thickness of about 80 Å on the amorphous $Se_{75}Ge_{25}$ layer. Thereafter, the exposure treatment was carried out using a 200 W mercury lamp with a photomask 5 close to the thin silver layer as shown in FIG. 11; the light intensity at the exposed surface was 16 mW/cm$^2$ and the exposure time was 150 seconds. After immersion in an aqueous diluted solution of aqua regia for 100 seconds (FIG. 12), etching was carried out in $CF_4$ gas plasma. The $CF_4$ gas plasma was produced by applying a high frequency field of 13.56 MHz to $CF_4$ gas maintained at a pressure of 0.5 Torr. The high frequency power was 100 W. Etching for 7 seconds completely removed the amorphous $Se_{75}Ge_{25}$ layer 22 in the non-exposed areas (FIG. 13). In this way, the silver-doped amorphous $Se_{75}Ge_{25}$ layer 21 was formed on the $SiO_2$ layer in a line and space pattern having a width of 1 μm.

EXAMPLE 2

Figure 14:
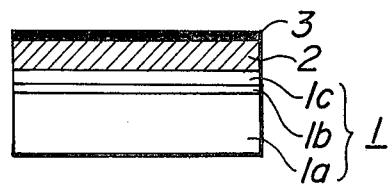
Figure 15:
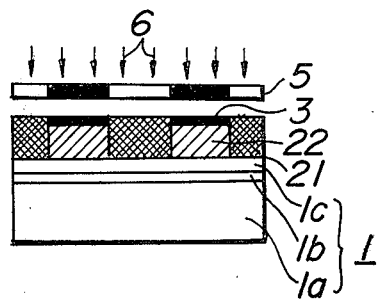
Figure 16:
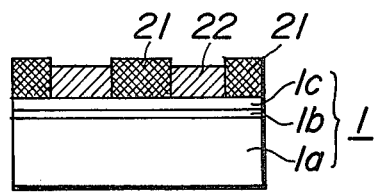
Figure 17:
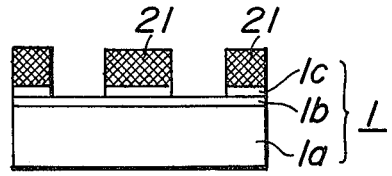

As shown in FIG. 14, a $SiO_2$ layer 1b with a thickness of 500 Å was formed on a silicon wafer 1a by thermal oxidation and then a Si polycrystal layer 1c with a thickness of 2000 Å was formed on the $SiO_2$ layer by CVD method. Then, the formation of amorphous $Se_{75}Ge_{25}$ layer 2, the formation of thin silver layer 3 and the exposure treatment were carried out in the same manner as described in Example 1 (FIG. 15). The treatment with a diluted solution of aqua regia was carried out under the same conditions as described in Example 1 (FIG. 16), and then the etching was performed in $CF_4$ gas plasma for 30 seconds, whereby amorphous $Se_{75}Ge_{25}$ layer 22 and Si polycrystal layer 1c in non-exposed areas were etched out to expose underlying $SiO_2$ layer (FIG. 17).

Figure 18:
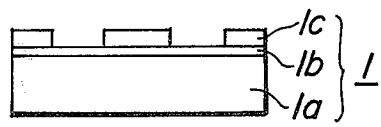

Next, the silver-doped amorphous $Se_{75}Ge_{25}$ layer was completely dissolved out by immersion in a hot concentrated sulfuric acid maintained at 200° C. for 30 seconds (FIG. 18). In this way, a line and space pattern having a width of 1 μm was formed on the Si polycrystal layer.

INDUSTRIAL APPLICABILITY

As mentioned above, the pattern-forming process according to the invention replaces the solution treatment stage in the conventionally proposed pattern-forming process using a radiation sensitive chalcogenide layer composed of a laminate of amorphous chalcogenide layer and thin silver layer with a gas plasma etching in a dry state, thereby completely eliminating many drawbacks accompanying the solution treatment, i.e., the requirement of strict control of solution quality, the problem of waste liquor disposal, the lack of reproducibility and stability, the unsuitability for automation and the like. Furthermore, the invention makes it possible to continuously conduct different treatment stages, so that the pattern-forming step may be simplified, the uniformity of the etching is good, and hence the reproducibility of fine pattern formation is good. Moreover, the pattern-forming process according to the invention makes it possible to conduct all stages in a dry state, and in this case, the above merits are further enhanced.

We claim:

1. A pattern-forming process, comprising the steps of exposing a radiation sensitive chalcogenide layer consisting of an amorphous chalcogenide layer and a thin silver layer successively superimposed on a substrate to a light or an accelerated corpuscular beam according to a given pattern to form silver-doped regions in the amorphous chalcogenide layer at exposed areas, and then etching out the amorphous chalcogenide layer not doped with silver in an etching stage with gas plasma to leave only silver-doped amorphous chalcogenide layer on the substrate according to the given pattern.

2. A pattern-forming process, comprising the steps of forming on a substrate a radiation sensitive chalcogenide layer consisting of an amorphous chalcogenide layer and a thin silver layer superimposed thereon, exposing it to a light or an accelerated corpuscular beam according to a given pattern to form silver-doped regions in the amorphous chalcogenide layer at exposed areas, etching out the amorphous chalcogenide layer not doped with silver in an etching stage with gas plasma, etching the substrate to a given depth at the areas not covered with the silver-doped amorphous chalcogenide layer as a mask by gas plasma etching, and then etching out the mask to form the given pattern on the substrate.

* * * * *

UNITED STATES PATENT AND TRADEMARK OFFICE
CERTIFICATE OF CORRECTION

PATENT NO. : 4,320,191

DATED : March 16, 1982

INVENTOR(S) : AKIRA YOSHIKAWA ET AL

It is certified that error appears in the above-identified patent and that said Letters Patent is hereby corrected as shown below:

On the title page the following should be added:

-- /30/ Foreign Application Priority Data

November 7, 1978  /JP/  Japan-----------53-137,132 --.

Signed and Sealed this

Thirtieth Day of October 1984

[SEAL]

Attest:

GERALD J. MOSSINGHOFF

Attesting Officer

Commissioner of Patents and Trademarks